(12) United States Patent
Moriya et al.

(10) Patent No.: US 9,148,591 B2
(45) Date of Patent: Sep. 29, 2015

(54) SOLID-STATE IMAGING DEVICE WITH AUTOFOCUS AND ELECTRONIC APPARATUS

(71) Applicant: SONY CORPORATION, Tokyo (JP)

(72) Inventors: Hitoshi Moriya, Kanagawa (JP); Kazuyoshi Yamashita, Kanagawa (JP); Hiroyuki Mori, Kanagawa (JP); Hiroaki Ishiwata, Tokyo (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 13/723,849

(22) Filed: Dec. 21, 2012

(65) Prior Publication Data
US 2013/0182156 A1    Jul. 18, 2013

(30) Foreign Application Priority Data
Jan. 13, 2012  (JP) ................. 2012-004799

(51) Int. Cl.
*H04N 5/225* (2006.01)
*H04N 5/335* (2011.01)
*H01L 27/146* (2006.01)

(52) U.S. Cl.
CPC ............ *H04N 5/335* (2013.01); *H01L 27/1461* (2013.01); *H01L 27/14605* (2013.01); *H01L 27/14607* (2013.01); *H01L 27/14623* (2013.01)

(58) Field of Classification Search
CPC .................................................. H04N 5/3696
USPC .................................. 348/273–283; 439/607
See application file for complete search history.

(56) References Cited

U.S. PATENT DOCUMENTS

| | | | | |
|---|---|---|---|---|
| 7,030,918 | B1* | 4/2006 | Nakashiba | 348/294 |
| 2010/0214453 | A1* | 8/2010 | Murata | 348/266 |
| 2011/0025904 | A1* | 2/2011 | Onuki et al. | 348/360 |
| 2011/0279727 | A1* | 11/2011 | Kusaka | 348/340 |
| 2012/0188425 | A1* | 7/2012 | Kita | 348/294 |
| 2012/0212662 | A1* | 8/2012 | Shimoda et al. | 348/349 |
| 2012/0300102 | A1* | 11/2012 | Tamura et al. | 348/294 |
| 2013/0088621 | A1* | 4/2013 | Hamada | 348/281 |
| 2013/0107086 | A1* | 5/2013 | Nagano | 348/273 |

* cited by examiner

*Primary Examiner* — Twyler Haskins
*Assistant Examiner* — Dwight C Tejano
(74) *Attorney, Agent, or Firm* — Sony Corporation

(57) ABSTRACT

There is provided a solid-state imaging device which includes a focus detection pixel that has a light shielding film, which is formed on a light receiving surface of a photoelectric conversion portion and shields light in a part of the light receiving surface, performs pupil division and photoelectric conversion of a received light flux and acquires a phase difference detection signal, where the light shielding film is formed avoiding a gate electrode of a reading gate portion to read a signal charge from the photoelectric conversion portion.

10 Claims, 10 Drawing Sheets

21 PHOTODIODE
22 TRANSFER TRANSISTOR (READING GATE PORTION)
23 RESET TRANSISTOR
24 AMPLIFICATION TRANSISTOR
25 SELECTION TRANSISTOR
26 FLOATING DIFFUSION (FD)

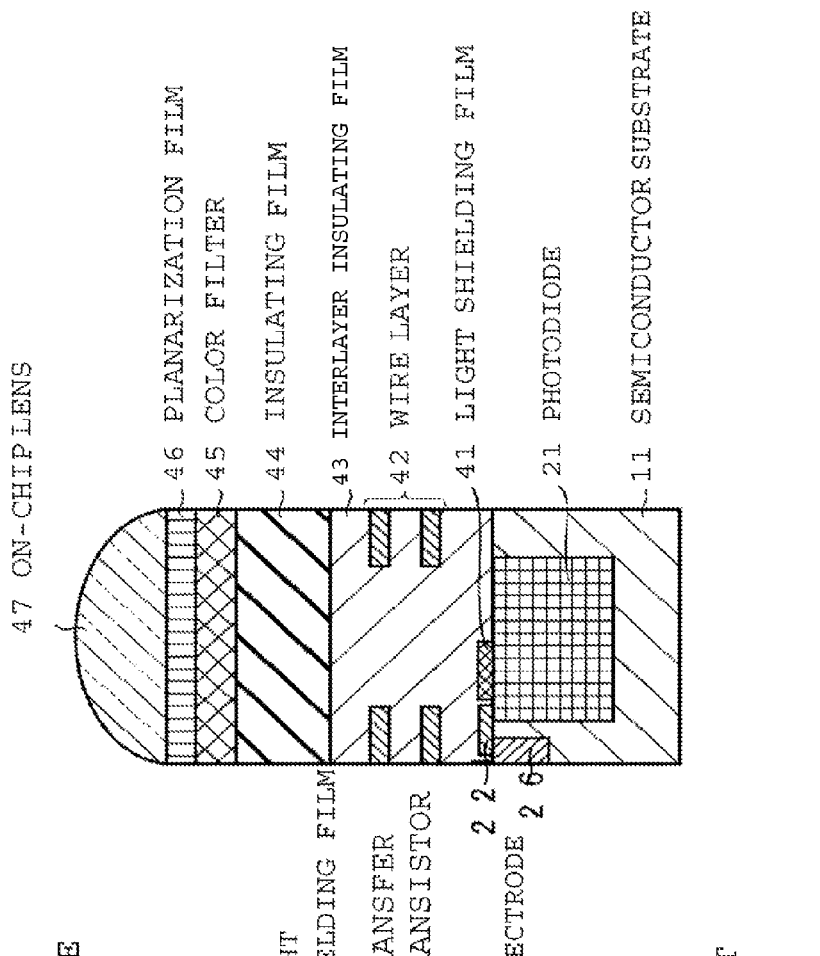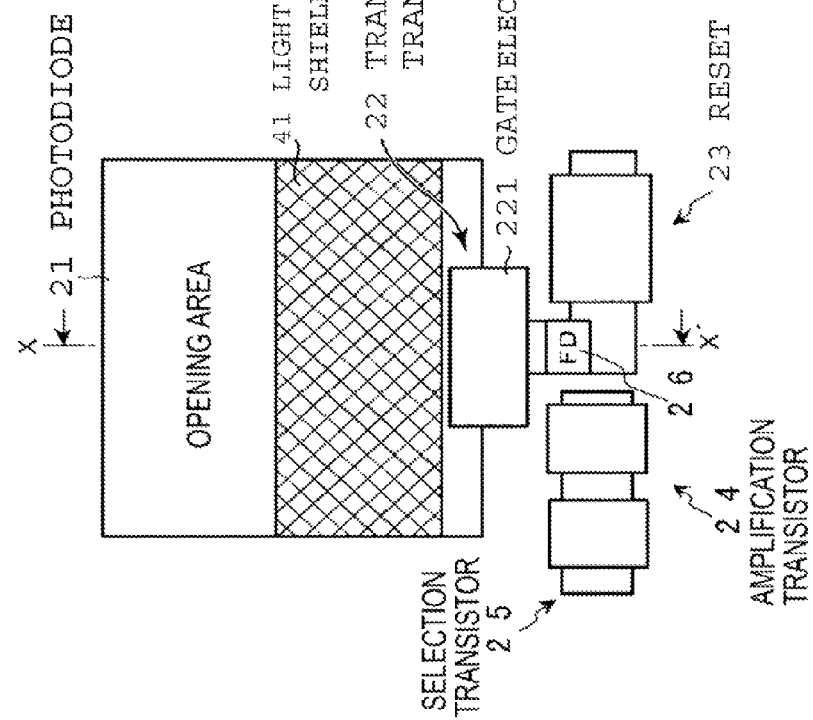

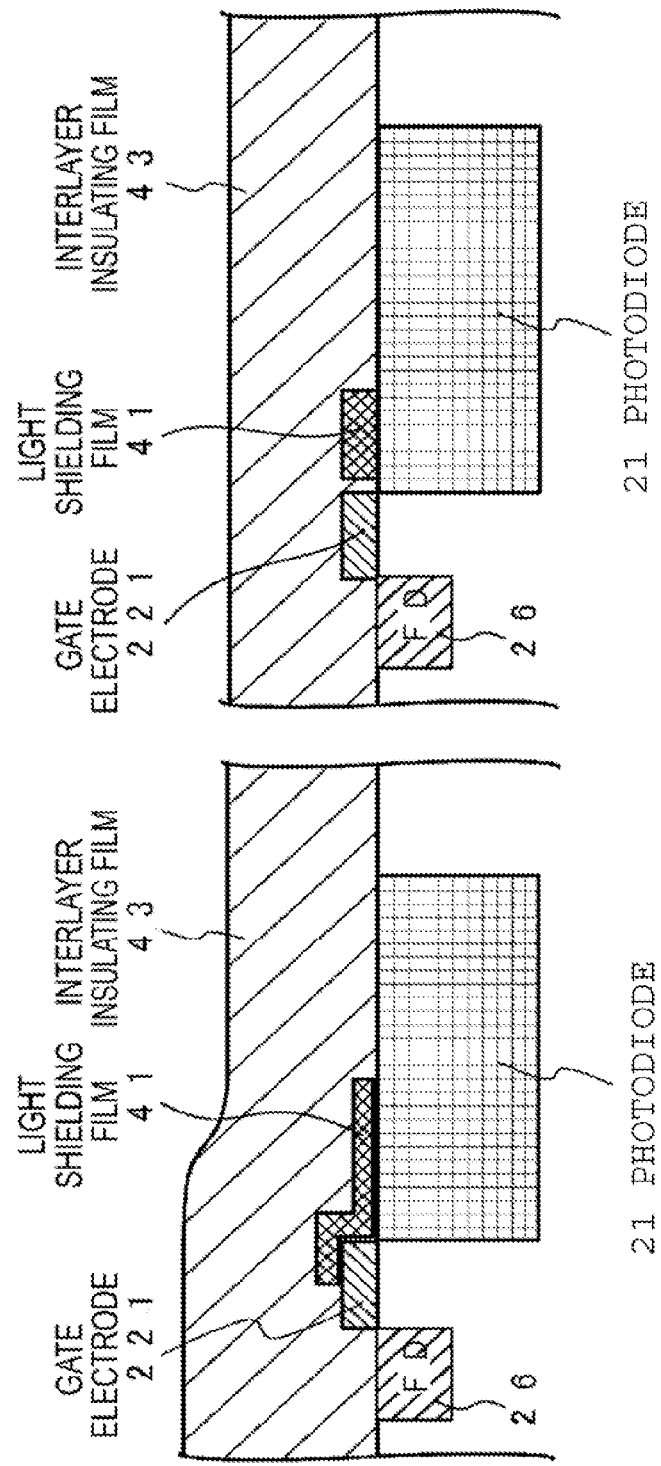

SOLID-STATE IMAGING DEVICE WITH AUTOFOCUS AND ELECTRONIC APPARATUS

BACKGROUND

The present disclosure relates to a solid-state imaging device and electronic equipment.

In the imaging device, autofocus (AF) methods to make a state in which the focus (point) is automatically adjusted, that is, the AF methods to make a focusing state automatically are roughly classified into a contrast detection method and a phase difference detection method. The phase difference detection method is superior to the contrast detection method in that a fast AF operation is possible. As this phase difference detection method, a pupil-division-type phase difference detection method is generally known.

The pupil-division-type phase difference detection method denotes a method of acquiring a phase difference detection signal indicating a defocus direction and defocus amount, using focus detection pixels provided separately from imaging pixels. An example of focus detection pixels used in this pupil-division-type phase difference detection method includes a pixel structure type to pupil-divide a light flux from an exit pupil area of an imaging lens and selectively receive light on a photoelectric conversion portion (for example, see Japanese Patent Laid-Open No. 2009-99817).

SUMMARY

In the pixel structure of focus detection pixels according to the above related art, to increase the phase difference detection accuracy, that is, to pupil-divide the light flux from the exit pupil area of the imaging lens accurately, a light shielding member is provided immediately above the photoelectric conversion portion. In this pixel structure, the light shielding member is formed to cover a gate electrode of a reading gate portion that reads a signal charge from the photoelectric conversion portion.

However, by setting the light shielding member to cover the gate electrode, a capacitance is formed between the light shielding member and the gate electrode, and therefore ii is inevitable to increase the capacitance of the gate electrode (i.e. capacitance attached to the gate electrode.) This gate electrode capacitance has a bad influence on the reading speed of signal charges of the focus defection pixels, specifically, it has a delaying influence on the reading speed. As a result, the phase difference detection speed is delayed and therefore the fast AF operation, which is an advantage of the phase difference detection method, may be impaired.

Therefore, in an embodiment of the present disclosure, it is desirable to provide: a solid-slate imaging device that can realize the fast AF operation while maintaining the high phase difference detection accuracy at the time of phase difference detection in the pupil-division-type phase difference detection method; and electronic equipment including the solid-state imaging device as an imaging portion (or image capture portion).

In view of the foregoing, it is desirable to provide a solid-stale imaging device which includes a focus detection pixel that has a light shielding film, which is formed on a light receiving surface of a photoelectric conversion portion and shields light in a part of the light receiving surface, performs pupil division and photoelectric conversion of a received light flux and acquires a phase difference detection signal, where the light shielding film is formed avoiding a gate electrode of a reading gate portion to read a signal charge from the photoelectric conversion portion.

The solid-state imaging device according to an embodiment of the present disclosure is a solid-state imaging device that is suitable to be used as an imaging portion (image capture portion) in electronic equipment including a mobile information terminal having an imaging function such as a digital still camera, a video camera and a mobile phone device, which adopts an autofocus method, especially, pupil-division-type phase difference detection method.

Since a light shielding film is formed on the light receiving surface of a photoelectric conversion portion, it is possible to shield light of an incident light flux with respect to the photoelectric conversion portion reliably, and therefore it is possible to maintain the high phase difference detection accuracy. At that time, by forming the light shielding film avoiding a gate electrode of a reading gate portion, it is possible to avoid forming a capacitance between the upper surface of the gate electrode and the upper surface of the light shielding film. Accordingly, even, if the light shielding film is formed on the light receiving surface of the photoelectric conversion portion, since the gate electrode capacitance is not increased, compared to a pixel configuration in which the light shielding film covers the gate electrode, it is possible to improve the reading speed of signal charges from the photoelectric conversion portion and, furthermore, the phase difference detection speed.

According to an embodiment of the present disclosure, the gate electrode capacitance is not increased even by forming a light shielding film on the light receiving surface of the photoelectric conversion portion, and therefore it is possible to improve the phase difference detection speed compared to the pixel structure in which the light shielding film covers the gate electrode. Accordingly, it is possible to realize the fast AF operation, which is an advantage of the phase difference detection method, while maintaining the high phase difference detection accuracy.

BRIEF DESCRIPTION OF THE DRAWINGS

FIG. 4 is a view illustrating a pixel configuration of a focus detection pixel, FIG. 4A is a schematic plan view of the focus detection pixel and FIG. 4B is an arrow cross-sectional view along the X-X line of FIG. 4A;

FIG. 5 is a cross-sectional view comparing a pixel configuration A associated with the related art in which a light shielding film covers a gate electrode, and a pixel configuration B associated with an embodiment in which a light shielding film does not cover a gate electrode;

Figure 1:
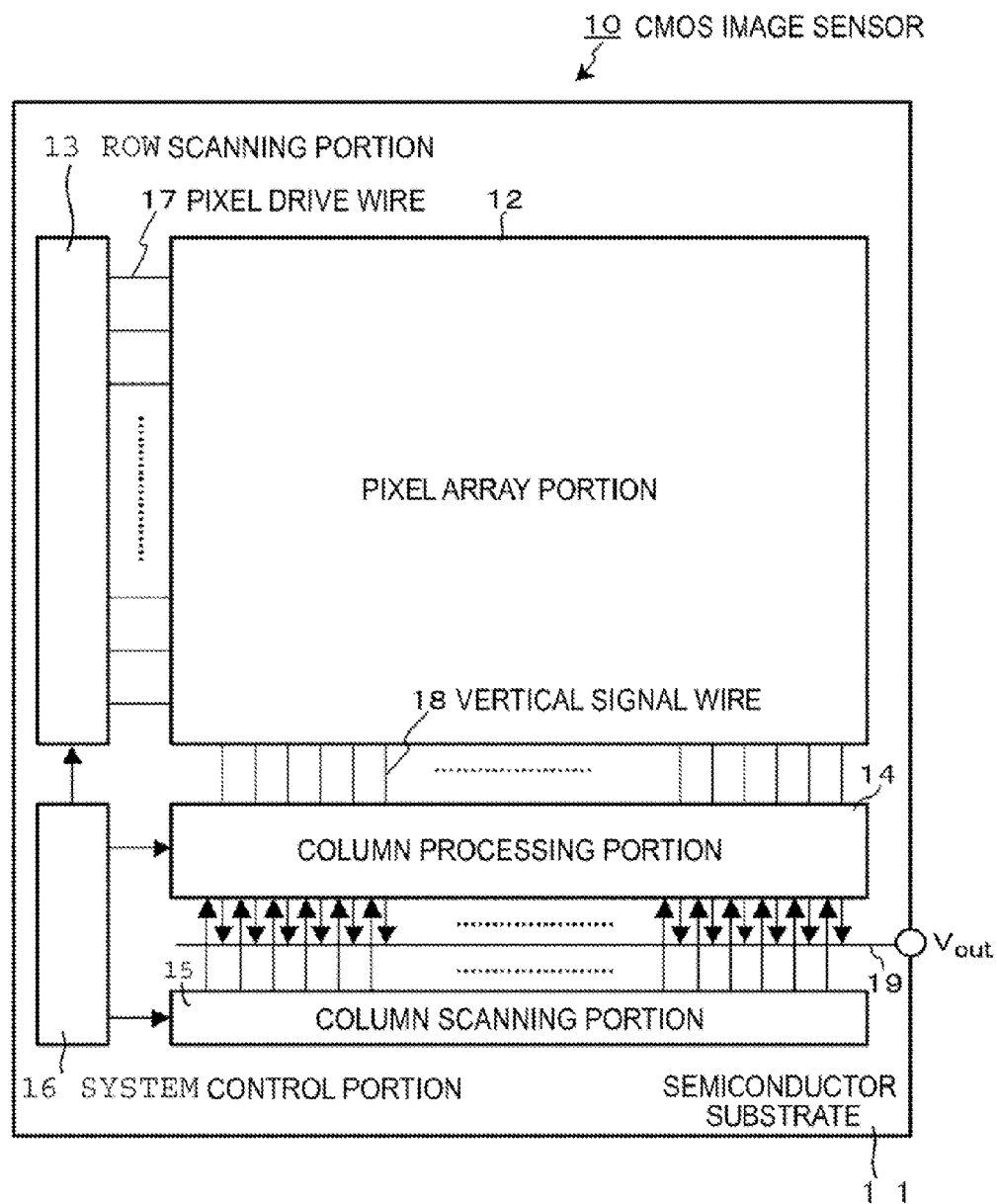
FIG. 1 is a system configuration view illustrating an outline of a system configuration of a CMOS image sensor to which the technology of the present disclosure is applied.

DETAILED DESCRIPTION OF THE
EMBODIMENT(S)

Hereinafter, preferred embodiments of the present disclosure will be described in detail with reference to the appended drawings. Note that in this specification and the appended drawings, structural elements that have substantially the same function and structure are denoted with the same reference numerals, and repeated explanation of these structural elements is omitted. Also, the explanation is given in the following order.
1. Overall explanation related to solid-state imaging device and electronic equipment of present disclosure
2. Embodiment
2-1. System configuration
2-2. Circuit configuration of unit pixel
2-3. Arrangement example of focus detection pixel
2-4. Pixel configuration of focus detection pixel
2-5. Example 1
2-6. Example 2
3. Electronic equipment (imaging device)
4. Configuration of present disclosure <1. Overall Explanation Related to Solid-state Imaging Device and Electronic Equipment of Present Disclosure>

The solid-state imaging device according to an embodiment of the present disclosure can be used as an imaging portion (or image capture portion) of electronic equipment such as an imaging device adopting the autofocus (AF) method, especially, a pupil-division-type phase difference detection method. Examples of the imaging device adopting the pupil-division-type phase difference detection method include a digital still camera and a video camera.

Also, examples of the electronic equipment according to an embodiment of the present disclosure include a mobile terminal device having an imaging function such as a mobile phone device, in addition to an imaging device such as a digital still camera and a video camera. Also, the technology of the present disclosure is applicable to overall electronic equipment adopting the pupil-division-type phase difference detection method and using a solid-state imaging device as an imaging portion (or image capture portion), in addition to an imaging device such as a digital still, camera and a video camera and a mobile terminal device having an imaging function such as a mobile phone device.

To realize pupil-division-type phase difference detection, the solid-state imaging device according to an embodiment of the present disclosure includes a focus detection pixel to perform pupil-division and photoelectric conversion of a received light flux aid acquire a phase difference detection signal. Here, the phase difference detection signal denotes a signal indicating a defocus direction and defocus amount, that is, a focus detection signal.

To realize the pupil-division-type phase difference detection, it is preferable to use a plurality of focus detection pixels, for example, two focus detection pixels as a pair. By using a phase difference detection signal output from the plurality of focus detection pixels, for example, the pair of focus detection pixels, it is possible to detect the defocus direction and the defocus amount.

The focus detection pixel is provided separately .from an imaging pixel to acquire an imaging signal, preferably, it is desirably intermingled with the imaging pixel in a pixel array portion formed by performing two-dimensional arrangement of imaging pixels in a matrix manner. To provide the focus detection pixels in the pixel array portion, for example, two focus detection pixels as a pair may be provided at appropriate intervals in the row direction of the pixel array portion or provided at appropriate intervals in the column direction of the pixel array portion.

Here, the "row direction" denotes the direction along the pixel row in the pixel array portion formed by performing two-dimensional arrangement of imaging pixels in a matrix manner, that is, the arrangement direction of pixels of the pixel row. Also, the "column direction" denotes the direction along the pixel column, that is, the arrangement direction of pixels of the pixel column. Also, not only in the row direction and the column direction but also in the diagonal direction, for example, two focus detection pixels as a pair may he provided.

In the solid-state imaging device according to an embodiment of the present disclosure, a focus detection pixel is formed on the light receiving surface of the photoelectric conversion portion and includes a light shielding film to shield light in a part of the light receiving surface. When the light shielding film is formed on the light receiving surface of the photoelectric conversion portion, it is possible to reliably shield light of an incident light flux with respect to the photoelectric conversion portion and therefore it is possible to maintain the high phase difference detection accuracy.

As a light shielding film, preferably, it is desirable to use the lowest layer film among a plurality of films laminated on the light receiving surface side of a focus detection pixel. Since the light receiving film is the lowest layer film, it is possible to shield light of an incident light flux with respect to the photoelectric conversion portion more reliably. Also, examples of materials of the light shielding film include tungsten (W) and titanium (Ti). Here, materials of the light shielding film are not limited to these materials and any material is possible as long as it is a light shielding material that enables pupil division of an incident light flux.

The solid-state imaging device according to an embodiment of the present disclosure has a feature where a light shielding film, which is formed on the light receiving surface of the photoelectric conversion portion and shields light in a part of the light receiving surface, is formed avoiding a gate electrode of a reading gate portion that reads a signal charge from the photoelectric conversion portion. Thus, by forming the light shielding film avoiding the gate electrode of the reading gate portion, it is possible to avoid a capacitance from being formed between the upper surface of the gate electrode and the upper surface of the light shielding film.

Accordingly, even if the light shielding film is formed on the light receiving surface of the photoelectric conversion portion to maintain the high phase difference detection accuracy, the gate electrode capacitance is not increased. As a result, compared to a pixel configuration in which the light shielding film covers the gate electrode, it is possible to improve the reading speed of signal charges from the photoelectric conversion portion and, furthermore, the phase difference detection speed.

If the light shielding Film is not formed in a state where it covers the gate electrode, there is a case where a gap is made between the side surface of the light shielding film on the light receiving surface of the photoelectric conversion portion and the side surface of the gate electrode. Preferably, it is desirable to cover this gap with a wire belonging to a higher layer than that the light shielding film. By covering the gap between the side surface of the light shielding film and the side surface of the gate electrode with the wire belonging to a higher layer than the light shielding film, it is possible to shield light of an incident light flux with respect to the photoelectric conversion portion more reliably.

Also, from a viewpoint that the electric potential of the light receiving surface of the photoelectric conversion portion is intended to he stabilized, regarding the light shielding film formed on the light receiving surface, it is preferable to apply a ground potential or power supply potential <2. Embodiment>

Before explaining a pixel configuration of focus detection pixels according to an embodiment of the present disclosure, a configuration of a solid-state imaging device to which the technology of the present disclosure is applied, for example, a configuration of a CMOS image sensor which is a kind of an amplification-type solid-state imaging device will be explained.

[2-1. System Configuration]

FIG. 1 is a system configuration view illustrating an outline of a system configuration of a CMOS image sensor. Here, the CMOS image sensor is a solid-state imaging device created applying CMOS process or using part of it.

A CMOS image sensor 10 according to the present application example employs a configuration including an pixel array portion 12 formed on a semiconductor substrate (which may be referred to as "chip" below) 11 and peripheral circuit portions collected on the same chip 11 as that of the pixel array portion 12. In the present example, as the peripheral circuit portions, for example, a row scanning portion 13, a column processing portion 14, a column scanning portion 15 and a system control portion 16 are provided.

In the pixel array portion 12, unit pixels (hereinafter simply referred to as "pixels") having a photoelectric conversion portion that produces light charges of a charge amount based on the light quantity of incident light and accumulates them inside, are subjected to two-dimensional arrangement in a matrix manner. Here, the "unit pixel" denotes an imaging pixel to acquire an imaging signal. A specific circuit configuration of the unit, pixel (or imaging pixel) will be described later.

Further, in the pixel array portion 12, a pixel drive wire 17 is wired along the row direction (i.e. pixel arrangement direction of pixel row) every pixel row with respect to the matrix pixel arrangement, and a vertical signal wire 18 is wired along the column direction (i.e. pixel arrangement direction of pixel column) every pixel column. The pixel drive wire 17 transmits a drive signal that drives a pixel which is output from the row scanning portion 13 in row units, Although FIG. 1 illustrates the pixel drive wire 17 as one wire, it is not limited to one wire. One end of the pixel drive wire 17 is connected to the output terminal corresponding to each row of the row scanning portion 13.

The row scanning portion 13 denotes a pixel drive portion that includes a shift register, an address decoder and so on, and that drives each pixel of the pixel array portion 12 in row units, for example. Although illustration of a specific configuration of this row scanning portion 13 is omitted, it generally employs a configuration including two scanning systems of a reading scanning system and sweeping scanning system.

The reading scanning system selectively and sequentially scans unit pixels of the pixel array portion 12 in row units to read signals from the unit pixels. The signal read from the unit pixel is an analog signal. The sweeping scanning system performs sweeping scanning with respect to the reading rows subjected to reading scanning in the reading scanning system, earlier than the reading scanning by the time of the shutter speed.

By the sweeping scanning in this sweeping scanning system, unnecessary charges are swept from photoelectric conversion elements of the unit pixels of the reading rows and therefore the photoelectric conversion elements are reset. Subsequently, by the sweeping (reset) of unnecessary charges in this sweeping seaming system, a so-called electronic shutter operation is performed. Here, the electronic shutter operation denotes an operation of discarding light charges of photoelectric conversion elements and starting an exposure (start accumulating the light charge) anew.

A signal read by the reading operation in the reading scanning system corresponds to the quantity of light entered after the previous reading operation or electron shutter operation. Subsequently, from the reading timing by the previous reading operation or the sweeping timing by the electron shutter operation, to a period by the reading timing of the current, reading operation is an accumulation period (i.e. exposure period) of light charges in unit pixels.

The signal output from each unit pixel of the pixel row selectively scanned by the row scanning portion 13 is supplied to the column processing portion 14 via each vertical signal wire 18. The column processing portion 14 performs predetermined signal processing on the signal output from each pixel of a selected row via the vertical signal wire 18, every pixel column of the pixel array portion 12, and temporarily holds the pixel signal after the signal processing.

To be more specific, the column processing portion 14 receives a unit pixel signal and performs signal processing such as noise removal by CDS (Correlated Double Sampling), signal amplification and AD (Analog-to-Digital) conversion on the signal. By the noise removal processing, reset noise and fixed pattern noise unique to pixels such as threshold variation of an amplification transistor are removed. Here, the exemplified signal processing is just an example and is not limited to these as signal processing.

The column scanning portion 15 includes a shift register, an address decoder and so on, and selects unit circuits corresponding to the pixel columns of the column processing portion 14 in order. By selective scanning by this column scanning portion 15, the pixel signals subjected to signal processing in the column processing portion 14 are output to a horizontal bus 19 in order and transmitted to the outside of the chip 11 via the horizontal bus 19.

The system control portion 16 receives a clock given from the outside of the chip 11 or data to instruct an operation mode, and outputs data such as internal information of the CMOS image sensor 10. Further, the system control portion 16 has a timing generator to generate various timing signals and performs drive control of peripheral circuit portions such as the row scanning portion 13, the column processing portion 14 and the column scanning portion 15 based on the various timing signals generated in the timing generator.

[2-2. Circuit Configuration of Unit Pixel]

Figure 2:
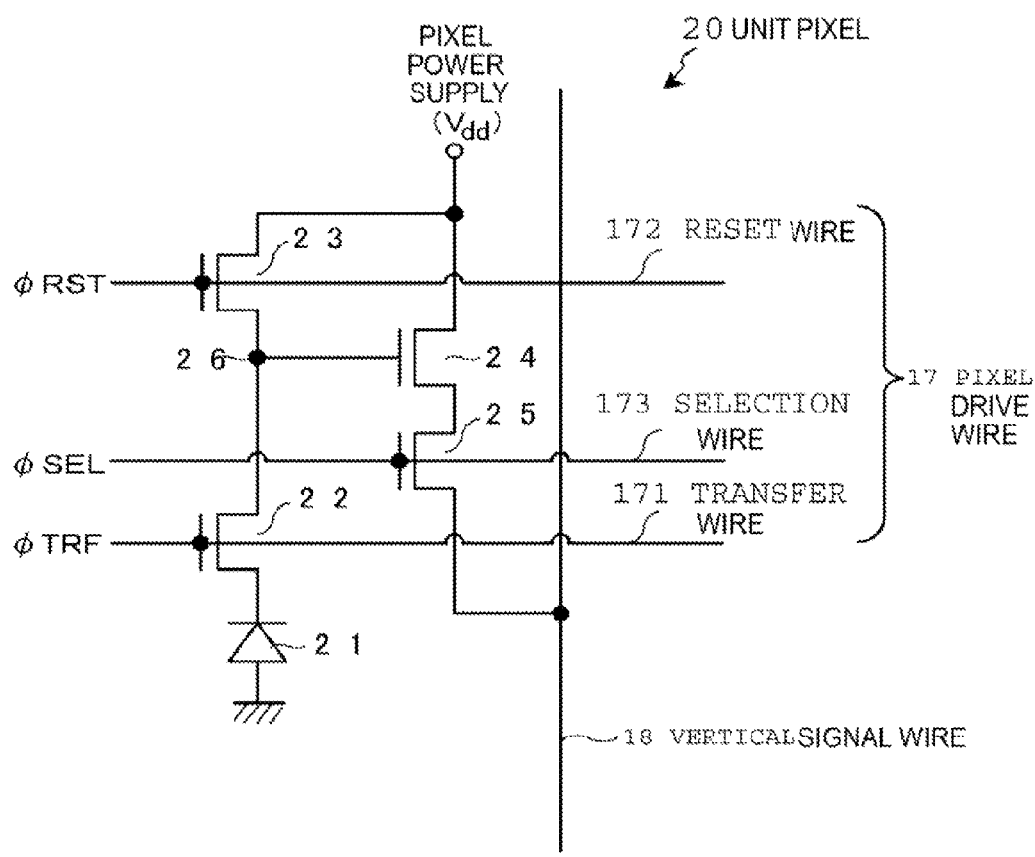
FIG. 2 is a circuit view illustrating an example of a circuit configuration of a unit pixel.

FIG. 2 is a circuit view illustrating an example of a circuit configuration of a unit pixel 20. As illustrated in FIG. 2, the unit pixel 20 according to the present circuit example uses, for example, a photodiode 21 as a photoelectric conversion portion. The unit pixel 20 includes, for example, four transistors of a transfer transistor (reading gate portion) 22, reset transistor 23, amplification transistor 24 and selection transistor 25, in addition to the photodiode 21.

Here, as these four transistors 22 to 25, for example, N-channel MOS transistors are used. However, a conductivity-type combination of these transfer transistor 22, reset transistor 23, amplification transistor 24 and selection transistor 25 exemplified herein is just an example, and it is not limited to this combination.

In this unit pixel 20, as the pixel drive wire 17, for example, three drive wires of a transfer wire 171, reset wire 172 and selection wire 173 are commonly set to each pixel of the same pixel row. Each one end of these transfer wire 171, reset wire 172 and selection wire 173 is connected to the output terminal corresponding to each pixel row of the row scanning portion 13 in a pixel row unit, to transmit a transfer pulse φTRF, reset pulse φRST and selection pulse φSEL as drive signals to drive the pixel 20.

In the photodiode 21, the anode electrode is connected to the negative-side power supply (e.g. ground) to perform photoelectric conversion of received light (or incident light) into light charges (photoelectron in this case) of the charge amount based on the light quantity and accumulates these light charges. The cathode electrode of the photodiode 21 is electrically connected to the gate electrode of the amplification transistor 24 via the transfer transistor 22. A node 26 electrically connected to the gate electrode of the amplification transistor 24 is referred to as "FD" (floating diffusion/ floating diffusion area) portion.

The transfer transistor 22 connects between the cathode electrode of the photodiode 21 and the FD portion 26. In the gate electrode of the transfer transistor 22, the transfer pulse φTRF in which the high level (e.g. $V_{dd}$ level) is active (hereinafter referred to as "High active") is given via the transfer wire 171. Accordingly, the transfer transistor 22 gets in a conduction state and transfers the light charges subjected to photoelectric conversion in the photodiode 21 to the FD portion 26.

In the reset transistor 23, the drain electrode is connected to the pixel power supply $V_{dd}$ and the source electrode is connected to the FD portion 26. In the gate electrode of the reset transistor 23, the reset pulse φRST of High active is given via the reset wire 172. Accordingly, the reset transistor 23 gets in a conduction state and resets the FD portion 26 by discarding charges of the FD portion 26 to the pixel power supply $V_{dd}$.

In the amplification transistor 24, the gate electrode is connected to the FD portion 26 and the drain electrode is connected to the pixel power supply $V_{dd}$. Subsequently, the amplification transistor 24 outputs the electrical potential of the FD portion 26 after being reset by the reset transistor 23, as a reset signal (reset level) $V_{reset}$. Further, as a light accumulation signal (signal level) $V_{sig}$, the amplification transistor 24 outputs the electrical potential of the FD portion 26 after the signal charges are transferred by the transfer transistor 22.

In the selection transistor 25, for example, the drain electrode is connected to the source electrode of the amplification transistor 24 and the source electrode is connected to the vertical signal wire 18. In the gate electrode of the selection transistor 25, the selection pulse φSEL of High active is given via the selection wire 173. Accordingly, the selection transistor 25 gets in a conduction state and, using the unit pixel 20 as a selective state, outputs a signal output from the amplification transistor 24, to the vertical signal wire 18.

Here, although the selection transistor 25 employs a circuit configuration connecting between the source electrode of the amplification transistor 24 and the vertical signal wire 18, it may employ a circuit configuration connecting between the pixel power supply $V_{dd}$ and the drain electrode of the transistor 24.

Also, the unit pixel 20 is not limited to the pixel configuration formed with four transistors having the above configurations. For example, it may employ a pixel configuration formed with three transistors using the amplification transistor 24 and the selection transistor 25, and the pixel circuit configuration does not matter.

[2-3. Arrangement Example of Focus Detection Pixel]

The CMOS image sensor 10 described above includes a focus detection pixel to acquire a phase difference detection signal in order to realize pupil-division-type phase difference detection. The phase difference detection signal denotes a focus detection signal indicating the defocus direction and defocus amount. Therefore, the focus detection pixel can be referred to as "phase difference detection pixel."

Figure 3:
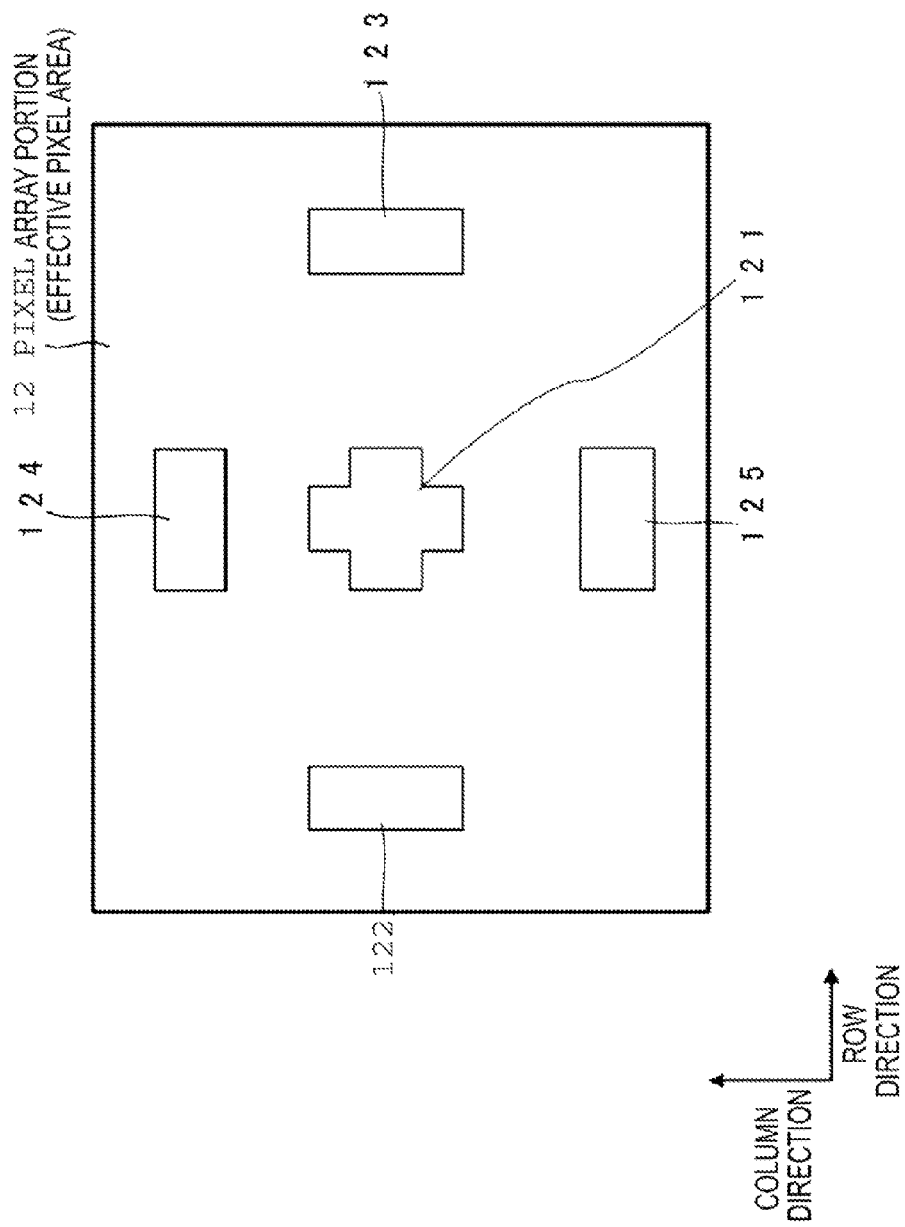
FIG. 3 is a schematic plan view illustrating an arrangement example of focus detection pixels in a pixel array portion in a patterned manner.

The focus detection pixel is provided in the pixel array portion 12 which is illustrated in FIG. 1 and includes imaging pixels subjected to two-dimensional arrangement in a matrix state, that is, in an effective pixel area. That is, the imaging pixel and the focus detection pixel are intermingled in the pixel array portion 12. FIG. 3 typically illustrates an arrangement example of focus detection pixels in the pixel array portion 12.

As illustrated in FIG. 3, the CMOS image sensor 10 includes a central area 121 of the pixel array portion 12, an area 122 on the left side of the central area 121, an area 123 on the right side of the central area 121, an upper-side area 124 and a lower-side area 125 as arrangement areas of focus detection pixels. Further, in these areas 121 to 125, a plurality of focus detection pixels are provided as a group.

However, the arrangement example of focus detection pixels illustrated in FIG. 3 is just an example and is not limited to these. For example, in the pixel array portion 12, the focus detection pixels may be periodically arranged along the row and column directions such that they are crossed each other in the central part, or the focus detection pixels may be periodically arranged over the effective pixel area.

[2-4. Pixel Configuration of Focus Detection Pixel]

Next, a pixel configuration of a focus detection pixel will be explained using FIG. 4. In FIG. 4, A is a schematic plan view of a focus detection pixel and B is an arrow cross-sectional view along the X-X line of A. Also, in A, a wire layer side configuration to capture incident light of the focus detection pixel is omitted.

A focus detection pixel 40 employs a configuration in which the photodiode 21 as a photoelectric conversion portion is formed on a surface layer part of the semiconductor substrate 11 and a light shielding film 41 to perform pupil division is formed on the light receiving surface of the photodiode 21. In this focus detection pixel 40, an interlayer insulating film 43 including a wire layer 42, an insulating film 44, a color filter 45, a planarization film 46 and an on-chip lens 47 are laminated in order on the light receiving surface of the photodiode 21.

Here, the light shielding film 41 is formed on the light receiving surface of the photodiode 21 as the lowest layer film among the plurality of films laminated on the light receiving surface side and performs pupil division by shielding light in a part of the light receiving surface. The light shielding film 41 can be formed with light shielding materials such as tungsten (W) and titanium (Ti). Here, materials of the light shielding film 41 are not limited to these materials and any material is possible as long as it is a light shielding material that enables pupil division of an incident light flux.

This light shielding film 41 is formed avoiding a gate electrode 221 of the transfer transistor 22 corresponding to a reading gate portion. That is, the light shielding film 41 is formed so as to not cover the gate electrode 221 at all. Also, from a viewpoint that it is possible to shield light of an incident light flux to the photodiode 21 more reliably, the light shielding film 41 is preferably formed in a slate where it is close to the light receiving surface of the photodiode 21. Also, for example, to stabilize the electric potential of the light receiving surface, a ground potential or power supply potential is applied to the light shielding film 41.

In the focus detection pixel 40 having the above configuration, a light flux passing through the on-chip lens 47 and the color filter 45 is pupil-divided by the light shielding film 41 on the light receiving surface of the photodiode 21. Subsequently, only the pupil-divided light flux on one side enters the photodiode 21 from the opening area in which light is not shielded by the light shielding film 41. The pupil-divided light flux on the other hand is restricted from entering the photodiode 21 by the light shielding film 41, that is, the light is shielded. The light flux having entered the photodiode 21 on one side is subjected to photoelectric conversion in the photodiode 21 and signal charges are accumulated in the photodiode 21. The signal charges accumulated in the photodiode 21 are transferred to tire FD portion 26 by the transfer transistor (reading gate portion) 22.

As described above, the light shielding film 41, which is formed on the light receiving surface of the photodiode 21 and shields light in a part of the light receiving surface, is formed avoiding the gate electrode 221 of the transfer transistor (reading gate portion) 22, and therefore it is possible to acquire the following operations and effects. That is, by forming the light shielding film 41 avoiding the gate electrode 221, it is possible to avoid a capacitance from being formed between the upper surface of the gate electrode 221 and the upper surface of the light shielding film 41.

Accordingly, even if the light shielding film 41 is formed on the light receiving surface of the photodiode 21 to maintain the high phase difference detection accuracy, the capacitance of the gate electrode 221 is not increased. As a result, compared to a pixel configuration of the related art in which the light shielding film 41 covers the gate electrode 221, it is possible to improve the reading speed of signal charges from the photodiode 21. Also, since it is possible to improve the reading speed of signal charges, it is possible to improve the detection speed of phase difference detection signals (i.e. phase difference detection speed) which are detected based on these read signal charges and which indicate the defocus direction and defocus amount.

Further, using FIG. 5, compared to the pixel configuration A of the related art in which the light shielding film 41 covers the gate electrode 221, operations and effects of the pixel configuration B of the present embodiment in which the light shielding film 41 does not cover the gate electrode 221, will be explained.

In the case of the pixel configuration A in which the light shielding film 41 covers the gate electrode 221, when forming the interlayer insulating film 43 after the light shielding film 41 is formed, the film thickness of the interlayer insulating film 43 is partially thickened by the light shielding film 41 on the gate electrode 221. Also, since a focus detection pixel with the light shielding film 41 and an imaging pixel without the light shielding film 41 are present together in the pixel array portion (effective pixel area) 12, it causes variation (unevenness) in the film thickness of the interlayer insulating film 43 and therefore may be a factor in preventing high image quality of the solid-state imaging device having the focus detection pixel.

By contrast with this, by adopting the pixel configuration B of the present embodiment in which the light shielding film 41 does not cover the gate electrode 221, since there is less configuration difference in the height direction between a normal imaging pixel and a focus detection pixel, variation in the film thickness of the interlayer insulating film 43 is reduced, which suppresses the unevenness. Accordingly, it is possible to achieve high image quality in a solid-state imaging device having a focus detection pixel.

Also, even if the planarization process is applied in the polishing process after the light shielding film 41 is formed, in the pixel configuration B of the present embodiment originally having high flatness, there is less influence of film thickness unevenness of the interlayer insulating film 43. By contrast with this, in the case of the pixel configuration A in which the light shielding film 41 covers the gate electrode 221, since it is requested to check the margins of the planarization process according to the height of the light shielding film 41 on the gate electrode 221, the pixel configuration B of the present embodiment is more advantageous even with respect to a lower layer.

As a result it can contribute to the sensitivity of normal imaging pixels and focus detection pixels and the F-value sensitivity. Further, the process stability is high and, in the process of forming and polishing the interlayer insulating film 43 after the light shielding film 41 is formed, it is possible to reduce the number of steps. Here, in FIG. 4, a pixel configuration without the light shielding film 41 is a pixel configuration of a normal imaging pixel.

A phase difference detection signal is detected using a plurality of focus detection pixels 40, for example, two focus detection pixels 40 ($40_A$, $40_B$) as a pair. In this pair of focus detection pixels $40_A$ and $40_B$, pupil-divided light flux on one side is received by the focus detection pixel $40_A$ and pupil-divided light flux on the other side is received by the focus detection pixel $40_B$.

Subsequently, by detecting relative positions (i.e. phase difference) of subject images acquired by this pair of focus detection pixels $40_A$ and $40_B$, it is possible to detect a phase difference detection signal indicating a defocus direction and defocus amount.

(2-5. example 1)

Next, in the pair of focus detection pixels $40_A$ and $40_B$, a specific example of light shielding patterns by the light shielding film 41 formed on the light receiving surface of the photodiode 21 will be explained as Example 1.

(Light Shielding Pattern example 1)

Figure 6:
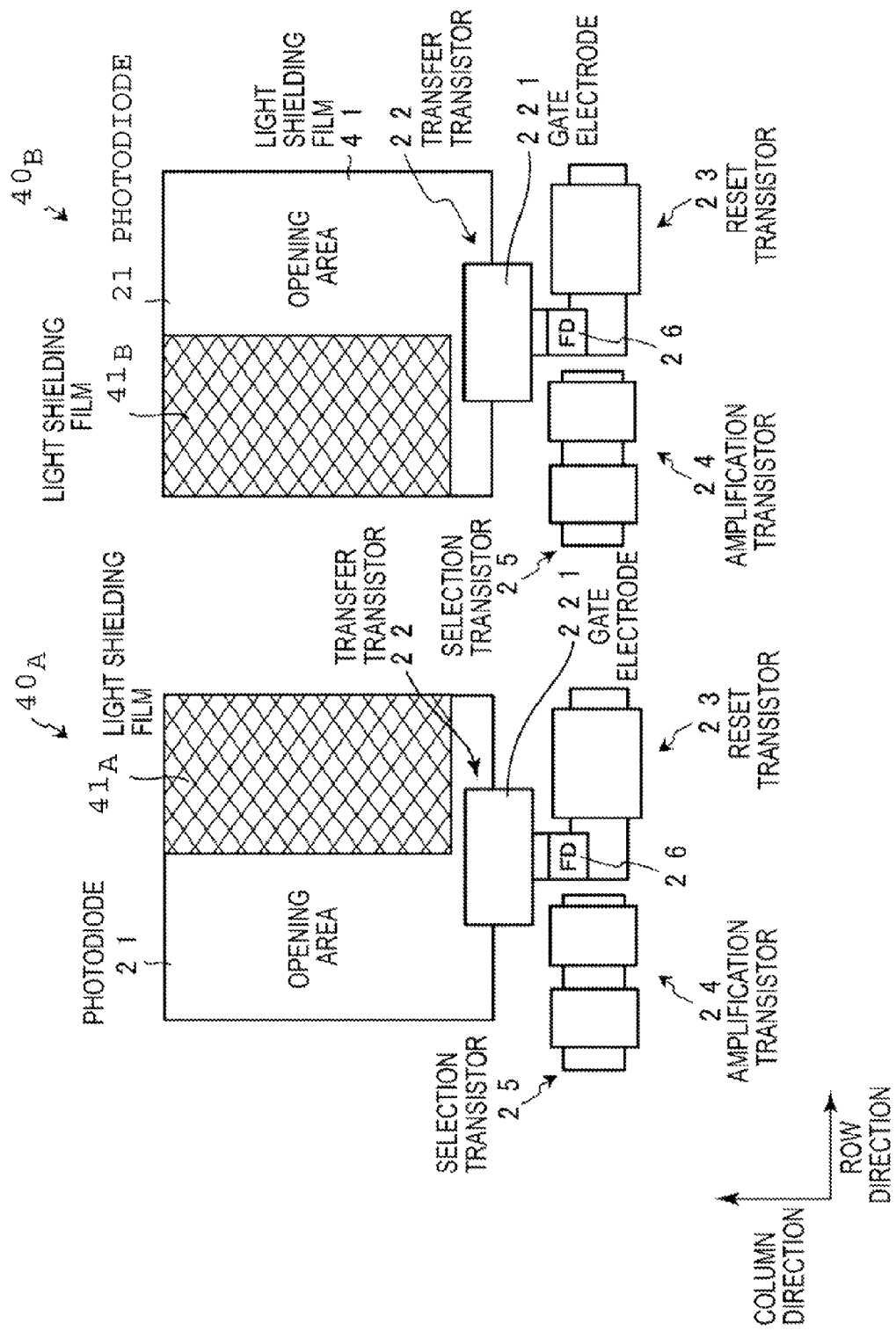
FIG. 6 is a schematic plan view illustrating light shielding pattern example 1 by a light shielding film in a pair of focus detection pixels.

FIG. 6 is a schematic plan view illustrating light shielding pattern example 1 by the light shielding film 41 in the pair of focus detection pixels $40_A$ and $40_B$.

As illustrated in FIG. 6, the pair of focus detection pixels $40_A$ and $40_B$ is adjacently provided right and left in the row direction, and each of them includes the transfer transistor 22, the reset transistor 23, the amplification transistor 24, the selection transistor 25 and the FD portion 26 in addition to the photodiode 21.

That is, the pair of focus detection pixels $40_A$ and $40_B$ each adopt a pixel configuration of a so-called FD-unshared scheme including the FD portion (diffusion layer portion) 26. Here, the pixel configurations of the focus detection pixels $40_A$ and $40_B$ are not limited to the FD-unshared scheme and the pixel configuration of the present embodiment is applicable to a pixel configuration of a so-called FD-shared scheme sharing the FD portion 26 between the focus detection pixels $40_A$ and $40_B$.

The light shielding film $41_A$ is formed such that, out of the pair of focus detection pixels $40_A$ and $40_B$, the focus detection pixel $40_A$ positioned on the left side shields light in substantially a half of an area on the side of the focus detection pixel $40_B$ (i.e. right side of the figure) on the light receiving surface of the photodiode 21. Meanwhile, the light shielding film $41_B$ is formed such that the focus detection pixel $40_B$ positioned on the right side shields light in substantially a half of an area on the side of the focus detection pixel $40_A$ (i.e. left side of the figure) on the light receiving surface of the photodiode 21.

In any of the focus detection pixels $40_A$ and $40_B$, the light shielding films $41_A$ and $41_B$ are formed avoiding the gate electrode 221 of the transfer transistor 22. The pair of focus detection pixels $40_A$ and $40_B$ having such a pixel configuration are arranged and used in the areas 122, 121 and 123 in FIG. 3, and thereby it is possible to perform pupil division in the row direction.

(Light Shielding Pattern Example 2)

Figure 7:
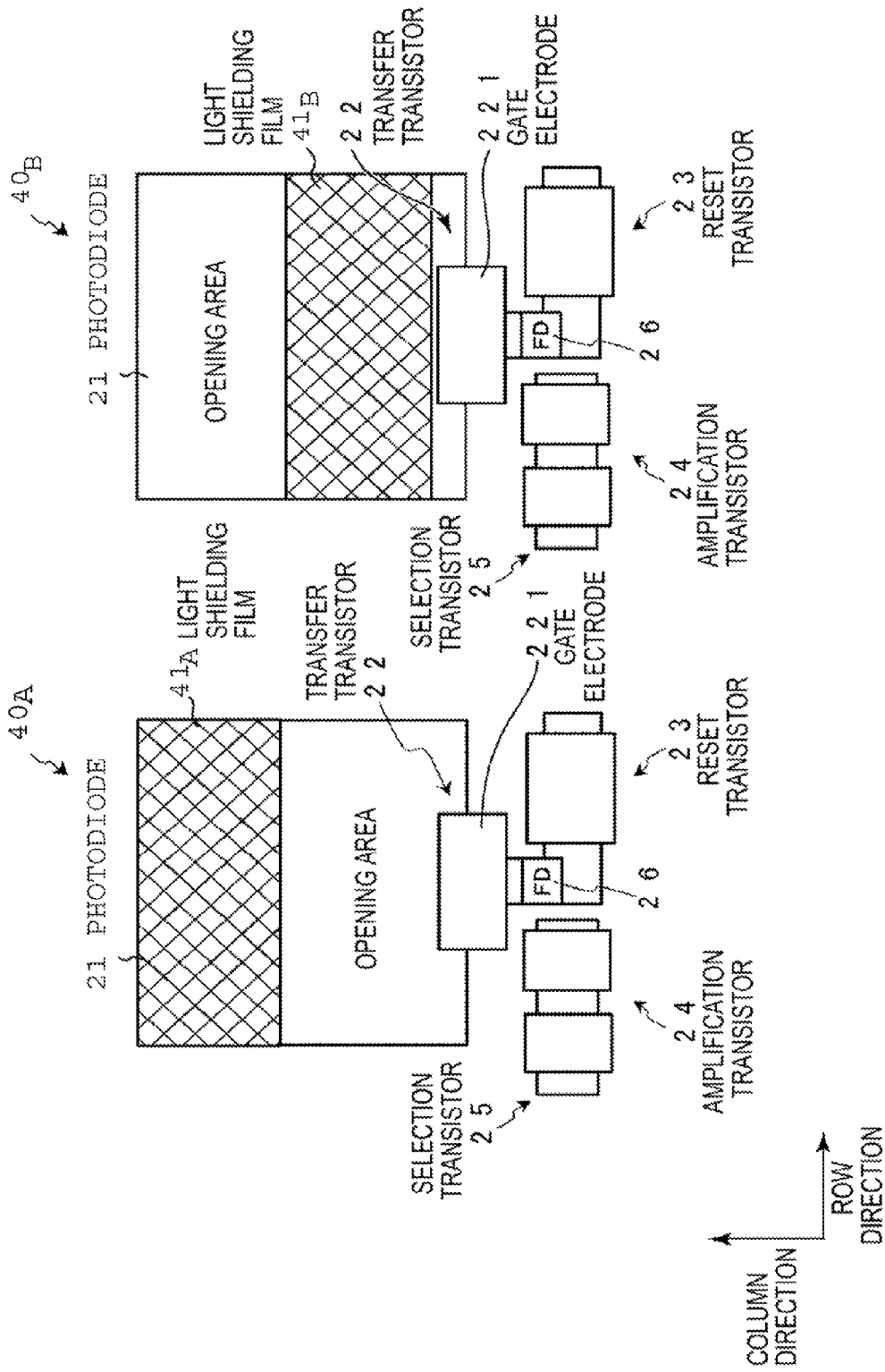
FIG. 7 is a schematic plan view illustrating light shielding pattern example 2 by the light shielding film in the pair of focus detection pixels.

FIG. 7 is a schematic plan view illustrating light shielding pattern example 2 by the light shielding film 41 in the pair of focus detection pixels $40_A$ and $40_B$.

As illustrated in FIG. 7, the pair of focus detection pixels $40_A$ and $40_B$ is adjacently provided right and left in the row direction and adopt a pixel configuration of the FD-unshared scheme including the FD portion 26. As described above, it may be a pixel configuration of the FD-shared scheme.

The light shielding film $41_A$ is formed such that, out of the pair of focus detection pixels $40_A$ and $40_B$, the focus detection pixel $40_A$ positioned on the left side shields light in substantially a half of an area on the opposite side (i.e. upper side in the figure) to the side on which a pixel circuit on the light receiving surface of the photodiode 21 is positioned. Meanwhile, the light shielding film $41_B$ is formed such that the focus detection pixel $40_B$ positioned on the right side shields light in substantially a half of an area on the side (i.e. lower side in the figure) on which the pixel circuit on the light receiving surface of the photodiode 21 is positioned. Here, the pixel circuit denotes a circuit including the transfer transistor 22, the reset transistor 23, the amplification transistor 24 and the selection transistor 25.

In any of the focus detection pixels $40_A$ and $40_B$, the light shielding flints 41a and $41_B$ are formed avoiding the gate electrode 221 of the transfer transistor 22. The pair of focus detection pixels $40_A$ and $40_B$ having such a pixel configuration are arranged and used in the areas 124, 121 and 125 in FIG. 3, and thereby it is possible to perform pupil division in the column direction.

Although the above light shielding pattern examples 1 and 2 have exemplified the pupil division in the row direction or column direction, the light shielding pattern examples are not limited to these and, for example, pupil division in the row and column directions is possible or pupil division in the diagonal direction is possible.

(2-6. Example 2)

By the way, when the light shielding films 41 ($41_A$, $41_B$) are not formed in a state where they cover the gate electrode 221, there may be a gap between the side surface of the light shielding film 41 on the light receiving surface of the photodiode 21 and the side surface of the gate electrode 221, and therefore it is concerned that light leaks into the photodiode 21 through the gap. The pixel configuration according to Example 2 denotes a pixel configuration created for a countermeasure of the gap between the Sight shielding film 41 and the gate electrode 221.

(Pixel Configuration 1)

Figure 8:
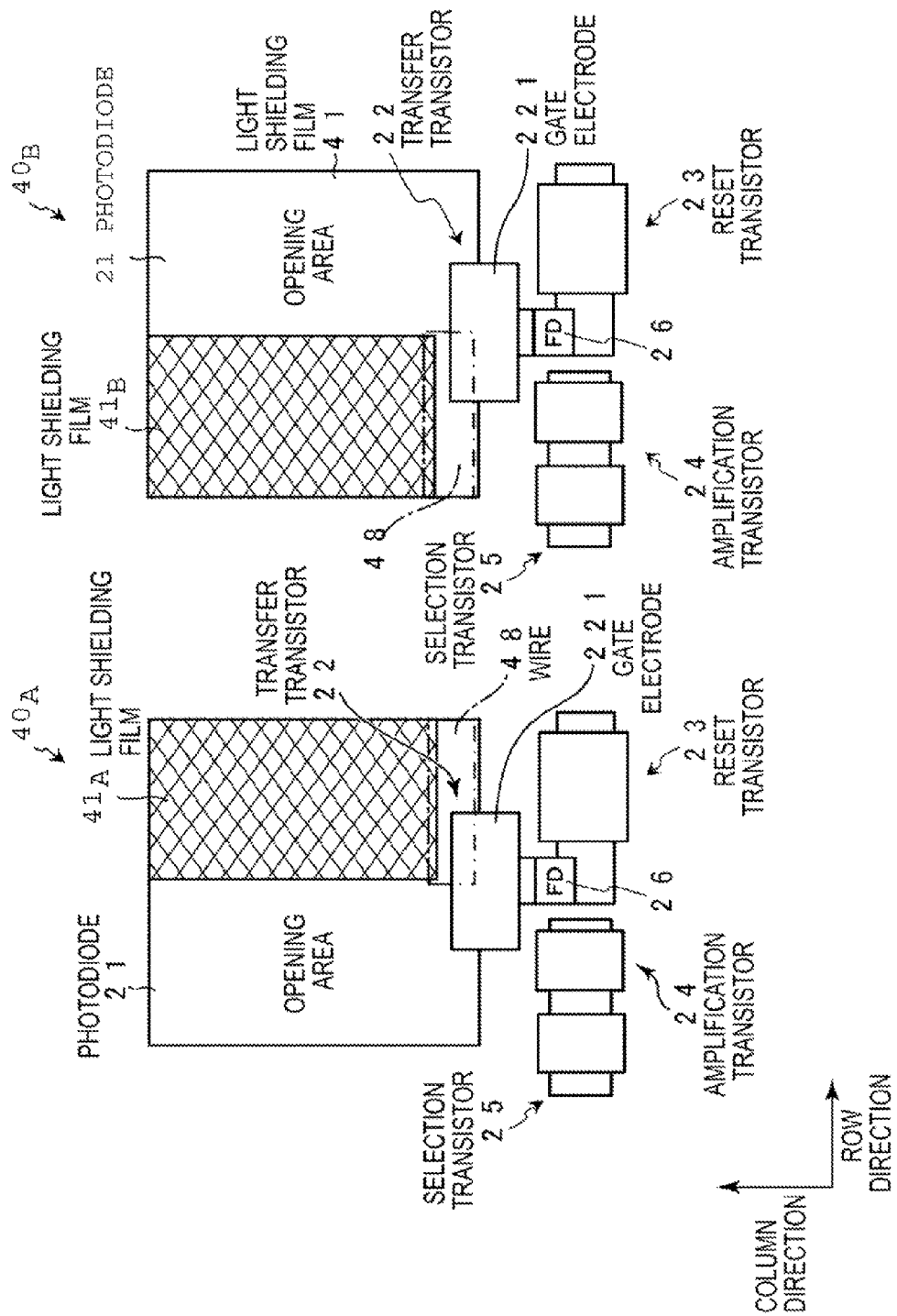
FIG. 8 is a schematic plan view illustrating a pixel configuration 1 in which a countermeasure to a gap between a light shielding film and a gate electrode is applied.

FIG. 8 is a schematic plan view illustrating a pixel configuration 1 in which a countermeasure to a gap between the light shielding film 41 and the gate electrode 221 is applied. The pixel configuration 1 corresponds to the light shielding pattern example 1. That is, the pixel configuration 1 denotes a pixel configuration created to prevent light from being leaked through a gap between the side surface of the gate electrode 221 and the side surfaces of the light shielding films $41_A$ and $41_B$ of the right and left focus detection pixels $40_A$ and $40_B$. To be more specific, by the wire 48 (illustrated by dashed-dotted line in the figure) belonging to a higher layer than the light shielding films $41_A$ and $41_B$, the pixel configuration is provided so as to cover the gap between the light shielding films $41_A$ and $41_B$ and the gate electrode 221. The wire 48 corresponds to, for example, a wire of the wire layer 42 in FIG. 4B.

(Pixel Configuration 2)

Figure 9:
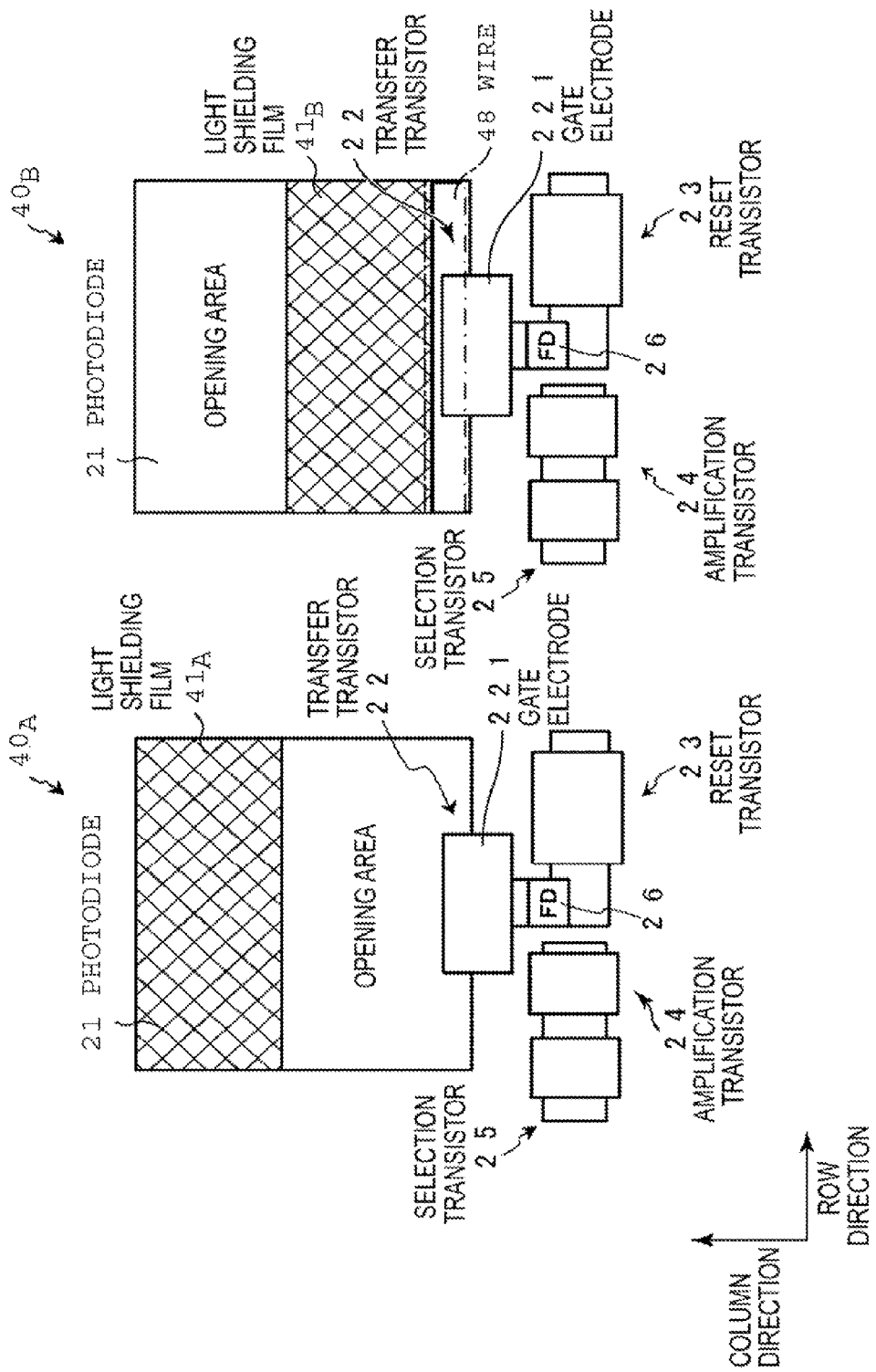
FIG. 9 is a schematic plan view illustrating a pixel configuration 2 in which a countermeasure to the gap between the light shielding film and the gate electrode is applied.

FIG. 9 is a schematic plan view illustrating a pixel configuration 2 in which a countermeasure to the gap between the light shielding film 41 and the gate electrode 221 is applied. The pixel configuration 2 corresponds to the light shielding pattern, example 2. That is, the pixel configuration 2 denotes a pixel configuration created to prevent light from being leaked through a gap between the side surface of the light shielding film $41_B$ of the right-side focus detection pixel $40_B$ and the side surface of the gate electrode 221. To be more specific, by the wire 48 (illustrated by dashed-dotted line in the figure) belonging to a higher layer than the light shielding film $41_B$, the pixel configuration is provided so as to cover the gap between the light shielding film $41_B$ and the gate electrode 221. The wire 48 corresponds to, for example, a wire of the wire layer 42 in FIG. 4B.

Like the pixel configurations 1 and 2 described above, by covering the gap between the side surfaces of the light shielding films 41 ($41_A$, $41_B$) and the side surface of the gate electrode 221 with the wire 48 belonging to a higher layer than the light shielding films 41, it is possible to shield light of an incident light flux with respect to the photodiode 21 more reliably.

<3. Electronic Equipment>

The present disclosure is not limitedly applicable to a solid-state imaging device and is applicable to overall electronic equipment adopting the pupil-division-type phase difference detection method using a solid-state imaging device as an imaging portion (or image capture portion), including an imaging device such as a digital still camera and a video camera and a mobile terminal device having an imaging function such as a mobile phone device.

[Imaging Device]

Figure 10:
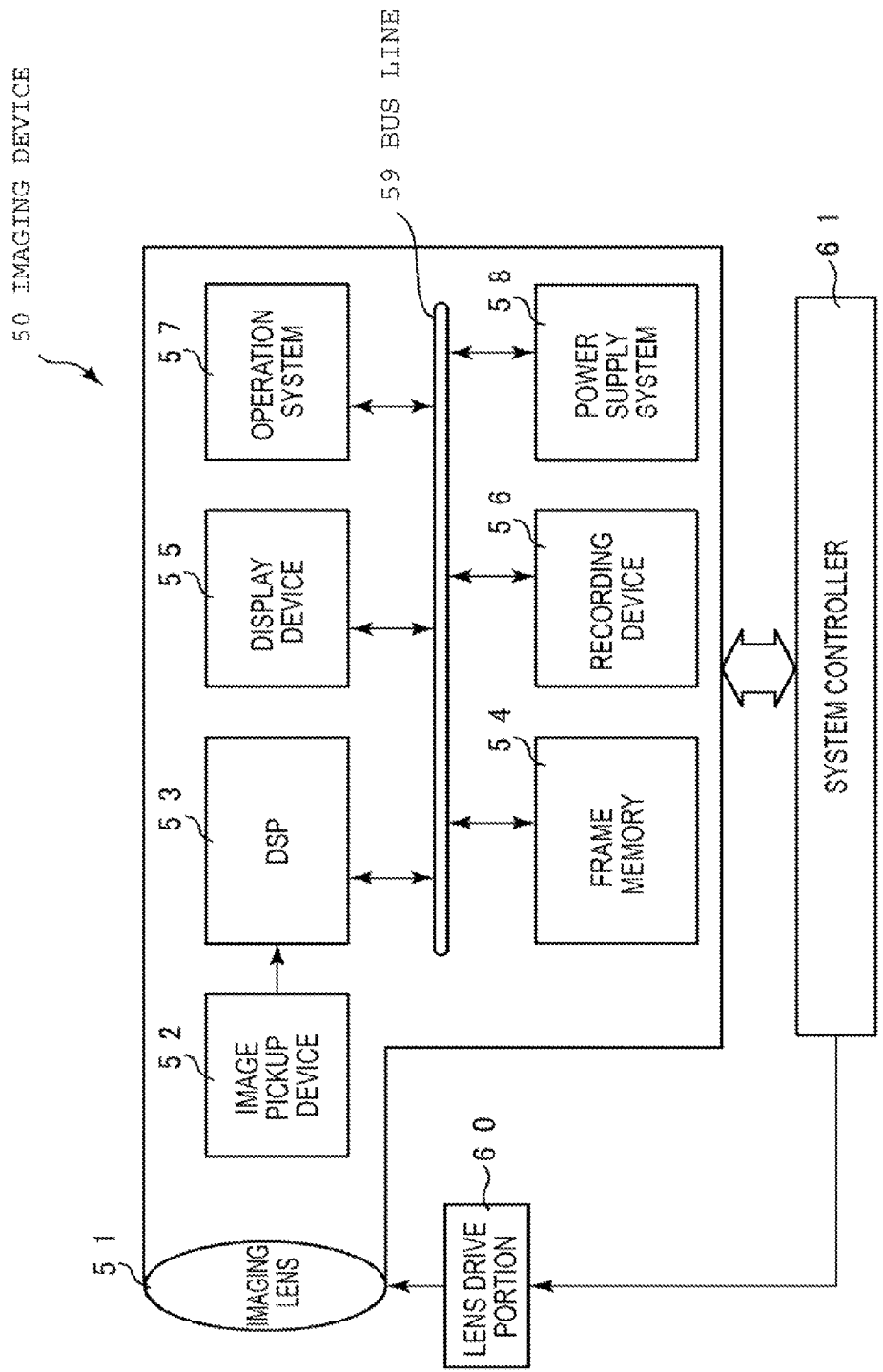
FIG. 10 is a block diagram illustrating a configuration example of an imaging device as electronic equipment according to an embodiment of the present disclosure.

FIG. 10 is a block diagram illustrating a configuration example of an imaging device as an example of electronic equipment according to an embodiment of the present disclosure.

As illustrated in FIG. 10, an imaging device 50 according to an embodiment of the present disclosure includes an optical system including an imaging lens 51, an image pickup device 52 and a DSP (Digital Signal Processor) circuit 53 as a camera signal processing portion, a frame memory 54, a display device 55, a recording device 56, an operation system 57 and a power supply system 58. Further, it has a configuration in which the DSP circuit 53, the frame memory 54, the display device 55, the recording device 56, then operation system 57 and the power supply system 58 are connected to each other via a bus line 59.

The imaging lens 51 captures incident light (image light) from the object and forms an image on the imaging surface of the image pickup device 52. The image pickup device 52 converts the light quantity of the incident light formed on the imaging surface by the imaging lens 51 into electric signals in pixel units and outputs these as pixel signals. As this image pickup device 52, it is possible to use the above CMOS image sensor according to the present embodiment including a focus detection pixel.

The display device 55 includes a panel-type display device such as a liquid crystal display device and an organic EL (Electro Luminescence) display device, and displays a motion picture or stationary picture imaged by the image pickup device 52. The recording device 56 records the motion picture or stationary picture imaged by the image pickup device 52, in a recording medium such as a videotape and DVD (Digital Versatile Disk).

The operation system 57 issues an operation instruction to various functions held by the present imaging device, under operation by the user. The power supply system 58 adequately gives various power supplies as operational power supplies of the DSP circuit 53, the frame memory 54, the display device 55, the recording device 56 and the operation system 57, to these supply targets.

The imaging device 50 according to an embodiment of the present disclosure further includes a lens drive portion 60 that drives the imaging lens 51 in its light axis direction. This lens drive portion 60 and the imaging lens 51 form a focus system for focus adjustment. Further, the imaging device 50 according to an embodiment of the present disclosure performs various kinds of control such as control of the focus system and control of each of the above components by the system controller 61.

Regarding the focus system control, based on a phase difference detection signal output from tire focus detection pixel of the CMOS image sensor according to the present embodiment described above, computation processing to calculate the defocus direction and defocus amount in, for example, the DSP circuit 53 is performed. In response to a result of this computation, the system controller 61 performs focus control to adjust a focus (point) by moving the imaging lens 51 in its light axis direction by the lens drive portion 60.

<4. Configuration of Present Disclosure>

Additionally, the present technology may also be configured as below.

(1) a solid-state imaging device including:
 a focus detection pixel that has a light shielding film formed on a light receiving surface of a photoelectric conversion portion and shielding light in a part of the light receiving surface, performs pupil division and photoelectric conversion on a received light flux and acquires a phase difference detection signal,
 wherein the light shielding film is formed avoiding a gate electrode of a reading gate portion that reads a signal charge from the photoelectric conversion portion.

(2) The solid-state imaging device according to (1), further including:
 a pixel array portion formed by arranging an imaging pixel to acquire an imaging signal,
 wherein the imaging pixel and the focus detection pixel are intermingled in the pixel array portion, (3) The solid-state imaging device according to (1) or (2),
 wherein the light shielding film is a lowest layer film among a plurality of films laminated on the light receiving surface of the focus detection pixel (4) The solid-state imaging device according to (3),
 wherein a gap between a side surface of the light shielding film on the light receiving surface of the photoelectric conversion portion and a side surface of the gate electrode is covered with a wire belonging to a higher layer than the light shielding -film.

(5) The solid-state imaging device according to any one of (1) to (4),
 wherein a ground potential or a power supply potential is applied to the light shielding film.

(6) The solid-state imaging device according to any one of (1) to (5),
 wherein the focus detection pixel includes a plurality of focus detection pixels; and wherein a defocus direction and a defocus amount are detected using phase difference detection signals output from the plurality of focus detection pixels.

(7) An electronic apparatus including:
 a solid-state imaging device including a focus detection pixel that has alight shielding film formed on a light receiving surface of a photoelectric conversion portion and shielding light in a part of the light receiving surface, performs pupil division and photoelectric conversion, of a received light flux and acquires a phase difference detection signal; and
 a focus mechanism that adjusts a focus based, on a phase difference detection signal output from the focus detection pixel,
 wherein the light shielding film is formed avoiding a gate electrode of reading gate portion that reads a signal charge from the photoelectric conversion portion.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application IP 2012-004799 filed in the Japan Patent Office on Jan. 13, 2012, the entire content of which is hereby incorporated, by reference.

What is claimed is:

1. A solid-state imaging device comprising:
 a focus detection pixel that has a light shielding film formed on a light receiving surface of a photoelectric conversion portion, the light shielding film shielding a part of the light receiving surface, the focus detection pixel configured to perform pupil division and photoelectric conversion on a received light flux and acquire a phase difference detection signal; and
 a gate electrode of a reading gate portion that reads a signal charge from the photoelectric conversion portion, wherein the light shielding film and the gate electrode are non-overlapping, and wherein a region between a side surface of the light shielding film on the light receiving surface of the photoelectric conversion portion and a side surface of the gate electrode is covered with a portion of a layer different from the light shielding film.

2. The solid-state imaging device according to claim 1, further comprising:
 a pixel array portion including an imaging pixel to acquire an imaging signal,
 wherein, the imaging pixel and the focus detection pixel are intermingled in the pixel array portion.

3. The solid-state imaging device according to claim 1, wherein the light shielding film is a lowest layer film among a plurality of films laminated on the light receiving surface of the focus detection pixel.

4. The solid-state imaging device according to claim 3, wherein the region between the side surface of the light shielding film on the light receiving surface of the photoelectric conversion portion and the side surface of the gate electrode is covered with a wire belonging to a higher layer than the light shielding film.

5. The solid-state imaging device according to claim 1, wherein a ground potential or a power supply potential is applied to the light shielding film.

6. The solid-state imaging device according to claim 1, wherein the focus detection pixel includes a plurality of focus detection pixels; and a defocus direction and a defocus amount are detected using phase difference detection signals output from the plurality of focus detection pixels.

7. An electronic apparatus comprising:
a solid-state imaging device including:
   a focus detection pixel that has a light shielding film formed on a light receiving surface of a photoelectric conversion portion, the light shielding film shielding a part of the light receiving surface, the focus detection pixel being configured to perform pupil division and photoelectric conversion of a received light flux and acquire a phase difference detection signal; and
   a gate electrode of a reading gate portion that reads a signal charge from the photoelectric conversion portion; and
a focus mechanism that adjusts a focus based on the phase difference detection signal output from the focus detection pixel, wherein the light shielding film and the gate electrode are non-overlapping, and wherein a region between a side surface of the light shielding film on the light receiving surface of the photoelectric conversion portion and a side surface of the gate electrode is covered with a portion of a layer different from the light shielding film.

8. The electronic apparatus according to claim 7, wherein the light shielding film is a lowest layer film among a plurality of films laminated on the light receiving surface of the focus detection pixel.

9. The electronic apparatus according to claim 8, wherein the region between the side surface of the light shielding film on the light receiving surface of the photoelectric conversion portion and the side surface of the gate electrode is covered with a wire belonging to a higher layer than the light shielding film.

10. A solid-state imaging device comprising:
a focus detection pixel that has a light shielding film on a light receiving surface of a photoelectric conversion portion, the light shielding film shielding a part of the light receiving surface, the focus detection pixel configured to perform pupil division and photoelectric conversion on a received light flux and acquire a phase difference detection signal; and
a gate electrode of a reading gate portion that reads a signal charge from the photoelectric conversion portion,
wherein the light shielding film and the gate electrode are non-overlapping,
wherein the light shielding film is a lowest layer film among a plurality of films laminated on the light receiving surface of the focus detection pixel, and
wherein a region between a side surface of the light shielding film on the light receiving surface of the photoelectric conversion portion and a side surface of the gate electrode is covered with a wire belonging to a layer higher than the light shielding film.

* * * * *